United States Patent
Burcea

(10) Patent No.: US 8,390,348 B2
(45) Date of Patent: Mar. 5, 2013

(54) TIME BASE GENERATOR AND METHOD FOR PROVIDING A FIRST CLOCK SIGNAL AND A SECOND CLOCK SIGNAL

(75) Inventor: George Burcea, Ajax (CA)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/408,402

(22) Filed: Feb. 29, 2012

(65) Prior Publication Data

US 2012/0223743 A1  Sep. 6, 2012

(30) Foreign Application Priority Data

Mar. 1, 2011 (EP) .................................. 11156426

(51) Int. Cl.
*H03L 7/06* (2006.01)
(52) U.S. Cl. ........................................ 327/156; 327/147
(58) Field of Classification Search .................. 327/156, 327/147
See application file for complete search history.

(56) References Cited

U.S. PATENT DOCUMENTS

| | | | |
|---|---|---|---|
| 4,521,778 A | 6/1985 | Knepper | |
| 4,943,787 A * | 7/1990 | Swapp | ................................ 331/2 |
| 5,391,996 A * | 2/1995 | Marz | ................................ 327/158 |
| 5,642,039 A * | 6/1997 | Bradley et al. | ................ 324/76.53 |
| 5,777,967 A * | 7/1998 | Ishibashi et al. | ................ 369/59.2 |
| 8,207,762 B2 * | 6/2012 | Burcea | ................................ 327/117 |
| 2010/0201408 A1 * | 8/2010 | Burcea | ................................ 327/115 |
| 2012/0223743 A1 * | 9/2012 | Burcea | ................................ 327/63 |

FOREIGN PATENT DOCUMENTS

| | | |
|---|---|---|
| EP | 2 207 263 | 7/2010 |
| GB | 2 267 609 | 12/1993 |

OTHER PUBLICATIONS

Lin, Tsung-Hsien et al: "An Agile VCO Frequency Calibration Technique for a 10-GHz CMOS PLL", IEEE Journal of Solid-State Circuits, vol. 42, No. 2, Feb. 2007, pp. 340-349.

* cited by examiner

*Primary Examiner* — Adam Houston
(74) *Attorney, Agent, or Firm* — Cozen O'Connor

(57) ABSTRACT

A time base generator and method for providing a first clock signal and a second clock signal comprising generating the first clock signal at a first clock frequency, dividing the first clock frequency by a first integer to produce a first auxiliary signal, dividing the second clock signal by a second integer to produce a second auxiliary signal, generating an error signal by individually weighting and comparing cycle durations or phasing of the first and second auxiliary signals, and generating the second clock signal by a voltage-controlled oscillator controlled by the error signal such that two clock signals of slightly different frequencies with defined time or phase delay are provided.

8 Claims, 4 Drawing Sheets

TIME BASE GENERATOR AND METHOD FOR PROVIDING A FIRST CLOCK SIGNAL AND A SECOND CLOCK SIGNAL

BACKGROUND OF THE INVENTION

1. Field of the Invention

The present invention relates to control systems and, more particularly, to a time base generator for providing a first clock signal and a second clock signal, and to a method for providing the first and second clock signals.

2. Description of the Related Art

Pulse radar ranging systems, such as those described in U.S. Pat. No. 4,521,778 to Knepper, provide distance or level measurements based on the direct measurement of the propagation time of microwave pulses transmitted to and reflected from a target, e. g., the surface of a fill material in a container. The propagation time for distances of a few meters is in the nanosecond range. As a result, a special time transformation procedure is required to enable measurement of these short time periods. The microwave pulses are transmitted to the target at a repetition rate or transmit clock frequency which is supplied by a transmit clock generator. In a signal mixer, the received echo pulses reflected from the target are sampled by cross-correlation with sampling pulses having the same shape as the transmit pulses, but at a sampling clock frequency that is slightly lower than the transmit clock frequency. The cross-correlation and subsequent integration or low-pass filtering leads to an intermediate frequency signal corresponding to the received echo pulses but time-expanded relative thereto by a factor of $T1/(T1-T2)$, where $T1$ is the transmit pulse repetition period and $T2$ is the sampling period. The time-expansion allows for amplifying, digitizing and further processing of the echo pulses with standard techniques.

Providing the transmit clock frequency and the sampling clock frequency requires a time base of very fine resolution, high accuracy, linearity and stability as these are directly related to measurement error. The jitter of the time base has to be maintained low because, when the jitter becomes significant with respect to the period of the carrier signal (microwave), the intermediate frequency signal suffers distortions, amplitude fluctuations and even cancellations.

The time base signals can be generated with digital or with analog circuits.

A digital time base generator having two clock signal generators of slightly different frequencies can benefit from the use of crystal oscillators and phase-locked loop (PLL) circuits, which allows the achievement of high accuracy and low jitter. However, as the oscillators start up, the phase difference between the clock signals is not predictable. If a detector for a zero phase delay is used, the detector has to be able to operate in the picoseconds range. Zero phase detector errors may diminish the merits of the digital solution and the measurement time is increased because a waiting time for zero phase detection has to be added.

An analog time base uses a linear ramp to generate the variable time delay. The thermal drift of the components results in time delay variations over temperature. U.S. Pat. No. 7,446,699 to McEwan discloses a technique that compensates such a thermal drift error. However, the analog signals having slower variation still produces a larger jitter from the voltage noise than the digital signals with fast transitions.

U.S. Pat. No. 4,943,787 to Swapp discloses a digital time base generator comprising a base clock signal generator providing a base clock signal at a base frequency, a first frequency multiplier multiplying the base frequency by a first integer to produce a first auxiliary signal, a first frequency divider dividing the frequency of the first auxiliary signal by the first integer to generate a first clock signal, a second frequency multiplier multiplying the base frequency by a second integer to produce a second auxiliary signal, and a second frequency divider dividing the frequency of the second auxiliary signal by the second integer to generate a second clock signal. Accordingly, the frequencies of the first and second clock signals are the same and identical to the base frequency. By altering the first or second integer divisor for a given number of cycles, a defined time delay can be set between the first and second clock signal.

EP 2 207 263 A1 discloses a base clock signal generator providing a base clock signal at a base frequency $f$, a first frequency divider dividing the base frequency by a first integer N to produce a first auxiliary signal, a first frequency multiplier multiplying the frequency of the first auxiliary signal by a factor K to generate the first clock signal, a second frequency divider dividing the base frequency by a second integer M to produce a second auxiliary signal, and a second frequency multiplier multiplying the frequency of the second auxiliary signal by the factor K to generate the second clock signal. Accordingly, the frequency of the first clock signal is $K \cdot f/N$ and that of the second clock signal $K \cdot f/M$. When setting $K=N$, the frequency of the first clock signal is equal to the base frequency $f$, and the first frequency divider and the first frequency multiplier can be omitted.

In practice, the frequencies of the first and second clock signals may be 3.000000 MHz and 2.999970 MHz, which requires the integer divisors N=300000 and M=299997. Accordingly, a major disadvantage of this conventional technique may be the long response time because the frequency multiplication is performed by a phase-locked loop (PLL) and each frequency adjustment can only be made after the two signals are checked around the coincidence moment when N periods of the first clock signal=M periods of the second clock signal. Several corrections are necessary to lock the PLL, and when large N and M divider ratios are required, it takes a very long time to bring the PLL into lock.

Another disadvantage may arise from the use of digital circuits that limit the circuit operation to integer numbers.

SUMMARY OF THE INVENTION

It is therefore an object of the invention to provide a time Base Generator and method for providing two clock signals of slightly different frequencies with defined time or phase delay.

This and other objects and advantages are achieved in Accordance with the invention in a time base generator including a first and a second clock signal having slightly different frequencies are created by a method comprising providing a first clock signal at the first clock frequency, dividing the first clock frequency by a first integer to produce a first auxiliary signal, dividing the second clock signal by a second integer to produce a second auxiliary signal, generating an error signal by individually weighting and comparing the cycle durations or phasing of the first and second auxiliary signals, and generating the second clock signal by means of a voltage-controlled oscillator controlled by said error signal.

The loop lock time is shorter because the adjustment of the frequency of the voltage-controlled oscillator is performed after a much shorter time than the time to reach coincidence between the first and second clock signals. Furthermore, the cycle durations or phasing of the first and second auxiliary signals do not have to be detected coincidentally which means that arbitrary, non-coincident signals can be processed in the same loop.

The error signal is preferably generated by time-to-voltage converting the first and second auxiliary signals and comparing the obtained voltages, where the individual weighting of the cycle durations or phasing of the first and second auxiliary signals may be performed during the time-to-voltage conversion or during the comparison of the obtained voltages, e.g., the obtained analog voltages can be independently scaled.

The time base generator and method in accordance with the invention are preferably used in a radar, laser or time-domain reflectometer, where the first clock signal triggers a transmitter to produce a transmit signal and where the second clock signal gates or is mixed with detected echoes of the transmit signal.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be now further described by way of a preferred example and with reference to the accompanying drawing, in which.

DETAILED DESCRIPTION OF THE PREFERRED EMBODIMENTS

Figure 1:
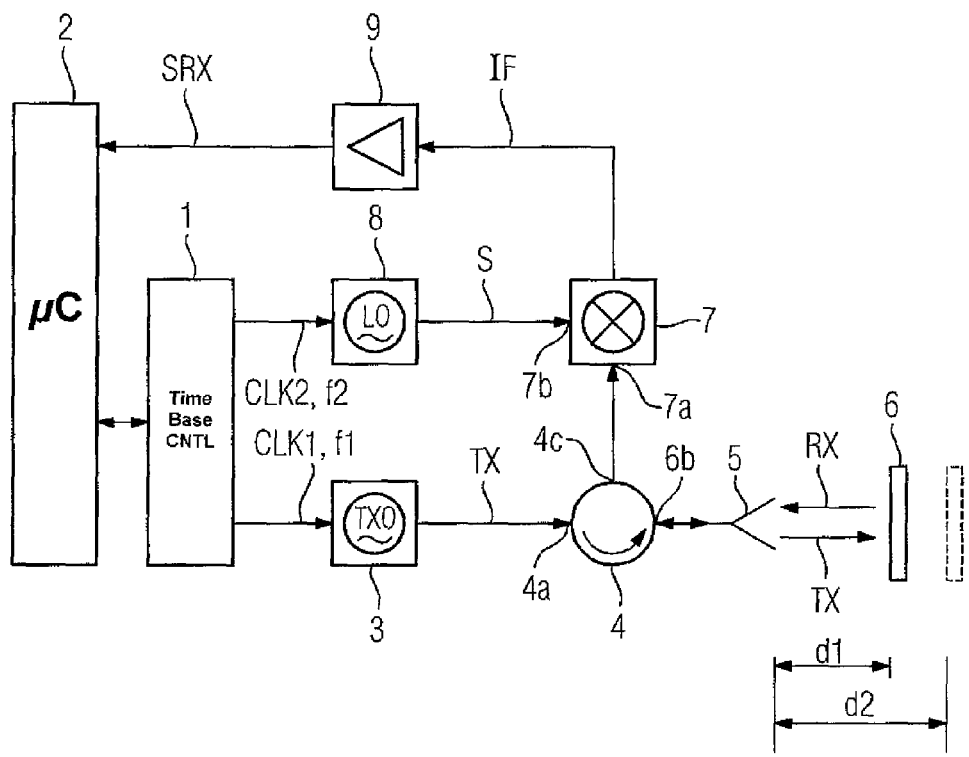
FIG. 1 is a schematic block diagram of a pulse radar ranging system comprising a time base generator in accordance with the invention.

With reference to FIG. 1, shown therein is the basic components of an exemplary pulse radar ranging system comprising a time base generator exemplary 1 in accordance with the invention. The time base control generator 1, which is under control of a microcontroller 2, generates a first clock signal CLK1 at a first clock frequency f1 in the MHz range. The first clock signal CLK1 triggers a transmit oscillator 3 to generate microwave transmit pulses TX with a pulse repetition rate equal to the first clock frequency f1. The transmit pulses TX may have a duration of 1 ns and a frequency in the GHz range. The transmit oscillator 3 is coupled to a first port 4a of a directional coupler device comprising a four-port circulator 4, a second port 4b of which is coupled to an antenna 5. The transmit pulses TX are transmitted through the circulator 4 and the antenna 5 to a target 6, e. g., the surface of a fill material in a container. The target 6 reflects the transmit pulses TX back as echo pulses RX which are received by the antenna 5. The received echo pulses RX are guided through the circulator 4 via a third port 4c to a first signal input 7a of a signal mixer 7.

The time base control generator 1 further generates a second clock signal CLK2 at a second clock frequency f2 which is slightly lower (for instance by a few Hz) than the first clock frequency f1. The second clock signal CLK2 triggers a local oscillator 8 for generating sampling pulses S of the same shape and frequency as the transmit pulses TX and with a pulse repetition rate equal to the second clock frequency f2. The sampling pulses S are conducted to a second signal input 7b of the signal mixer 7 which generates an intermediate frequency signal or down-converted signal IF by multiplying the received echo pulses RX by the sampling pulses S. The pulse repetition rate of the sampling pulses S is slightly lower than that of the transmit pulses TX. As a result, the sampling pulses S will sweep in small increments per measuring cycle over the transmit or echo pulse interval so that the received echo pulses RX are sampled by cross-correlation with the sampling pulses S. The cross-correlation and subsequent integration and amplification by an IF amplifier 9 lead to a signal SRX which is expanded in time and in shape corresponds to the received echo pulses RX. This signal SRX is further processed in the microcontroller 2 to determine the time required for the transmit pulses TX to propagate to the target 6 and thus the distance d of the target 6 from the antenna 5.

Figure 2:
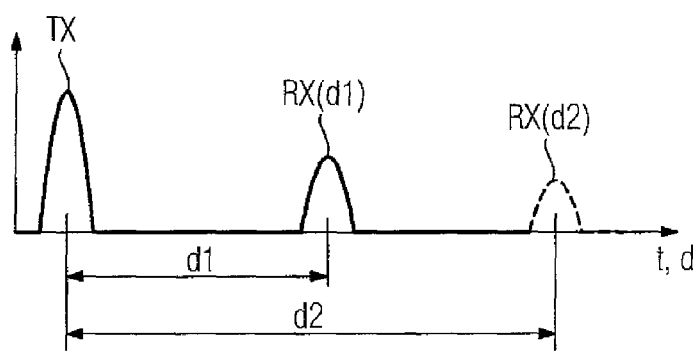
FIG. 2 is graphical plot of a timing diagram showing transmit and echo pulses in the pulse radar ranging system of FIG. 1.

FIG. 2 is a graphical plot of a time diagram of the transmit pulses TX and echo pulses RX (more precisely, the down-converted signal IF) for two different distances d1 and d2. The down-converted signal IF only appears when an echo pulse RX reaches the mixer 7 at the same time as a sampling pulse S, i.e., the delay of signal S (or CLK2) relative to signal TX (or CLK1) equals the propagation delay of TX to the target 6 and back.

Figure 3:
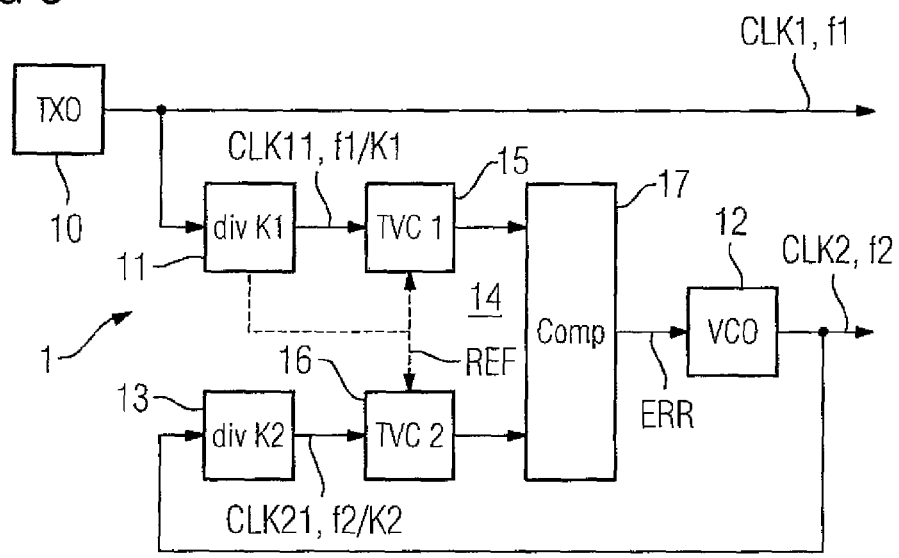
FIG. 3 is a schematic block diagram of the time base generator in accordance with the invention.

FIG. 3 is an exemplary schematic block diagram of the time base generator 1 in accordance with the invention. The time base generator 1 comprises a base clock signal generator 10 which generates the first clock signal CLK1 at the first clock frequency f1. A first frequency divider 11 which divides the first clock frequency f1 by a first integer K1 to produce a first auxiliary signal CLK11. The second clock signal CLK2 with the second clock frequency f2 is generated by a voltage-controlled oscillator 12 and, in a second frequency divider 13, divided by a second integer K2 to produce a second auxiliary signal CLK21. As described below in more detail, a phase/period comparator 14 generates an error signal ERR by individually weighting and comparing the cycle durations or phasing of the first and second auxiliary signals CLK11, CLK21, and controls the voltage-controlled oscillator (VCO) 12 to generate the second clock signal CLK2. The comparator 14 comprises a first time-to-voltage converter 15 receiving the first auxiliary signal CLK11, a second time-to-voltage converter 16 receiving the second auxiliary signal CLK21 and a voltage comparator (differential amplifier) 17 connected to the voltage outputs of the first and a second time-to-voltage converters 15, 16.

Figure 4:
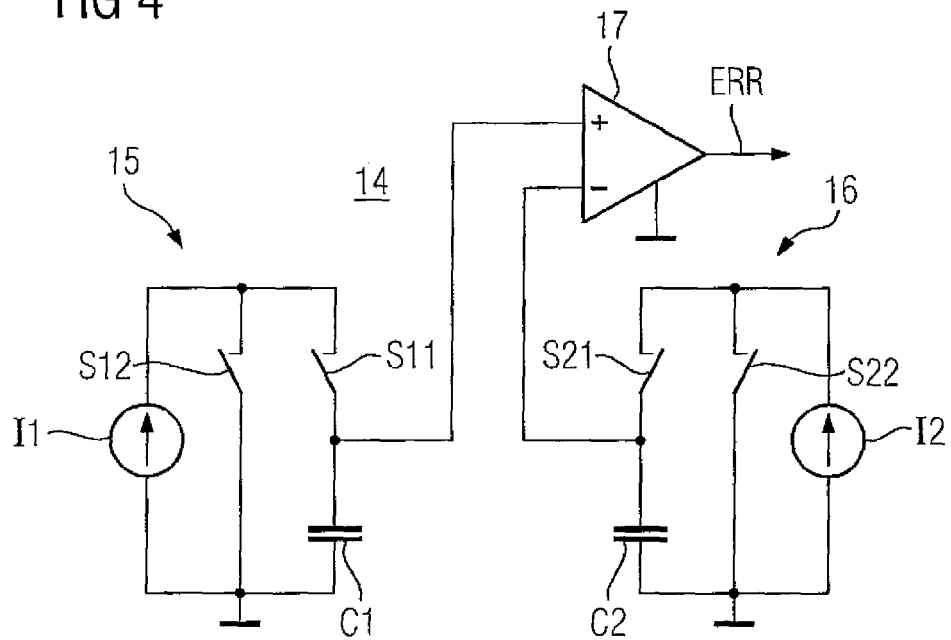
FIG. 4 is a schematic block diagram of a phase/period comparator that forms part of the time base generator of FIG. 3.

FIG. 4 shows a simplified exemplary phase/period comparator 14 comprising the first and a second time-to-voltage converters 15, 16 and the voltage comparator 17. The first time-to-voltage converter 15 has a constant current source 11 in series with a capacitor C1 and a first switch S11. A second switch S12 is in parallel with the constant current source 11. The second time-to-voltage converter 16 has a constant current source 12 in series with a capacitor C2 and a first switch S21. A second switch S22 is in parallel with the constant current source 12. The voltage comparator 17 senses and compares the voltages over the capacitors C1 and C2. The switches S11 and S12 of the first time-to-voltage converter 15 are controlled by the first auxiliary signal CLK11, whereas the second auxiliary signal CLK21 controls switches S21 and S22 of the second time-to-voltage converter 16.

In a first embodiment, the time-to-voltage converters 15 and 16 generate a voltage proportional to the cycle durations of the respective first and second auxiliary signals CLK11, CLK21. Thus, for example, switch S11 is closed and switch S12 is open when and as long as the first auxiliary signal CLK11 is high so that the voltage over capacitor C1 linearly increases with time. When the first auxiliary signal CLK11 drops to a low level, switch S11 is opened and switch S12 is closed so that the capacitor C1 holds the voltage. After a hold time, switch S11 is closed to discharge capacitor C1. The second time-to-voltage converter 16 works equally for the second auxiliary signal CLK21, however, the detected cycle durations of the first and second auxiliary signals CLK11, CLK21 are differently weighted. The different weighting may be achieved in that the constant current sources 11, 12 provide different currents, the capacitors C1, C2 have different capacities and/or the voltage comparator 17 senses the voltages over the capacitors C1, C2 with different gains.

Figure 5:
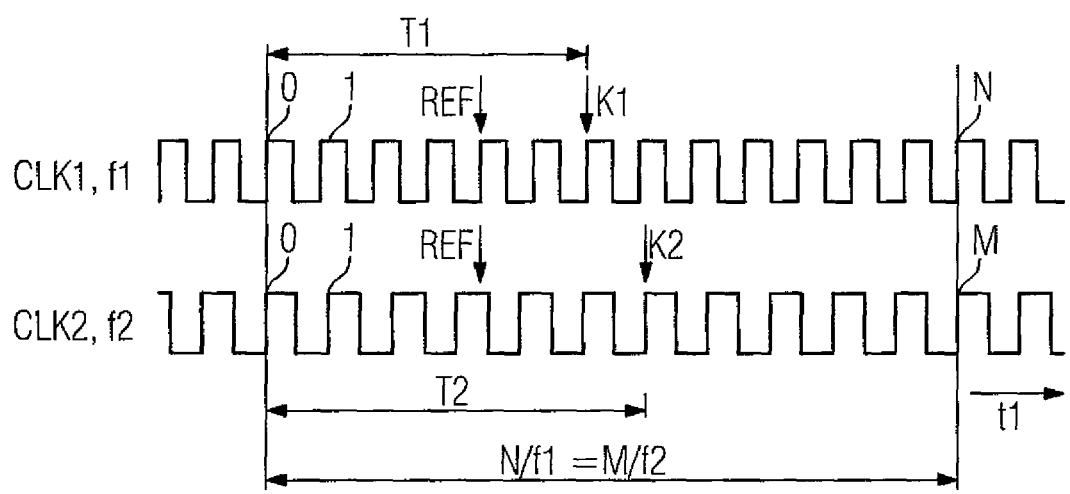
FIG. 5 is a graphical plot of a timing diagram showing signals generated in and by the time base generator of FIG. 3.

FIG. 5 is a graphical plot of a timing diagram of the signals CLK1, and CLK2. The first time-to-voltage converter 15 provides a voltage which is proportional to the cycle duration T1=K1/f1 of the first auxiliary signal CLK11. The second time-to-voltage converter 16 provides a voltage which is proportional to the cycle duration T2=K2/f2 of the second auxiliary signal CLK21. The cycle duration T1=K1/f1 is weighted by a factor G1 and the cycle duration T2=K2/f2 is weighted by a factor G2 before the error signal ERR is generated from their difference. Accordingly, the voltage-controlled oscillator 12 is controlled to adjust and maintain the relationship:

$$G1 \cdot (K1/f1) = G2 \cdot (K2/f2)$$

or $$f1/f2 = (K1/K2) \cdot (G1/G2) = N/M.$$

In practice, where the numbers are, e.g., N=300000 and M=299997 (for f1=3.000000 MHz and f2=2.999970 MHz), the integer divisors K1 and K2 can be much smaller, e.g., in the range of hundreds or thousands, and they may be different or equal. The cycle durations T1 and T2 of the auxiliary signals CLK11 and CLK21 may be measured independently by the respective time-to-voltage converters 15 and 16 at any arbitrary chosen moment. As it takes only K1 of signal CLK1 and K2 cycles of signal CLK2 to determine the cycle durations T1 and T2 of the auxiliary signals CLK11 and CLK21, the frequency of the voltage-controlled oscillator 12 is adjusted after a much shorter time than the time to reach coincidence between the first and second clock signal CLK1 and CLK2, i.e., when N/f1=M/f2. The control loop will monitor and adjust the period and phase of the second clock signal CLK2 of the voltage-controlled oscillator 12 in relation to the first clock signal CLK1. As a result, loop control and VCO frequency adjustment is performed with analog signals derived from the relative phase or periods of the digital signals.

In a second embodiment, the phasing of the first and second auxiliary signals CLK11 and CLK21 is used to control the voltage-controlled oscillator 12. The time to voltage conversion can be started simultaneously for both time-to-voltage converters 15, 16 at an arbitrary reference moment by a reference signal REF related to the first clock signal CLK1 and stopped independently at the rising (or falling) edge of the first auxiliary signal CLK11 for the first time-to-voltage converter 15 and at the rising (or falling) edge of the second auxiliary signal CLK21 for the second time-to-voltage converter 16. The position of the rising (or falling) edge of the second auxiliary signal CLK21 in relation with the rising (or falling) edge of the first auxiliary signal CLK11 is adjusted and maintained by individually weighting and comparing the voltages from the time-to-voltage converters 15 and 16 and controlling the voltage-controlled oscillator 12. The edges of the auxiliary signals CLK11 and CLK21 do not have to be coincident as the outputs of the time-to-voltage converters 15 and 16 are processed independently with different weighting (gain) factors G1 and G2.

Figure 6:
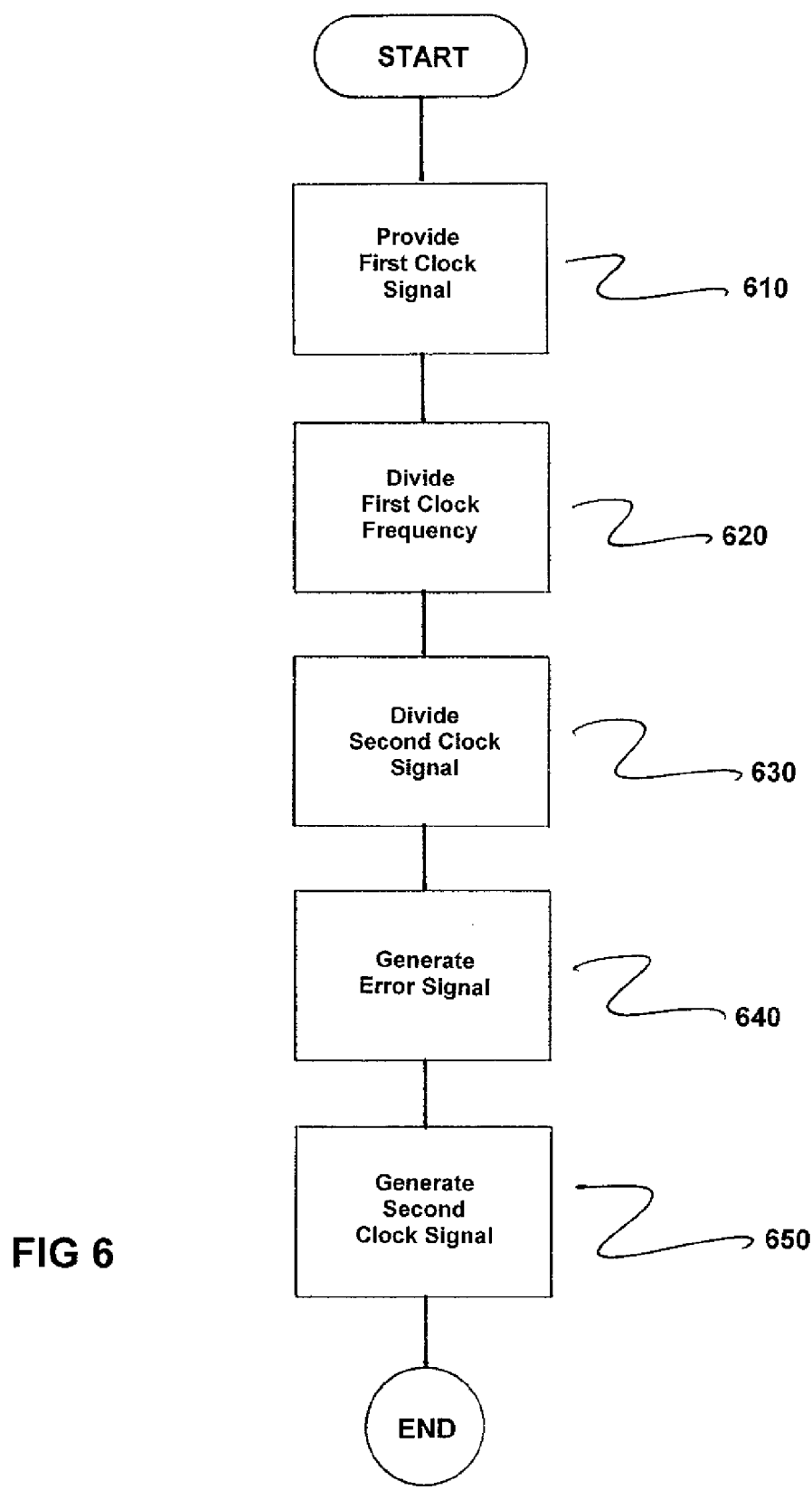
FIG. 6 is a flow chart of the method in accordance with an embodiment of the invention.

FIG. 6 is a flow chart of a method for providing a first clock signal (CLK1) and a second clock signal (CLK2), where frequencies (f1, f2) of the clock signals (CLK1, CLK2) are different from each other. The method comprises providing the first clock signal (CLK1) at a first clock frequency (f1), as indicated in step 610.

The first clock frequency (f1) is divided by a first integer (K1) to produce a first auxiliary signal (CLK11), as indicated in step 620. A second clock signal (CLK2) is divided by a second integer (K2) to produce a second auxiliary signal (CLK21), as indicated in step 630.

An error signal (ERR) is generated by individually weighting and comparing cycle durations or phasing of the first and second auxiliary signals (CLK11, CLK21), as indicated in step 640.

The second clock signal (CLK2) is generated by the voltage-controlled oscillator (12) which is controlled by the error signal (ERR), as indicated in step 650.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A time base generator for providing a first clock signal and a second clock signal, the frequencies of said clock signals being different, said time base generator comprising:
   a clock signal generator providing the first clock signal at the first clock frequency;
   a first frequency divider configured to divide the first clock frequency by a first integer to produce a first auxiliary signal;
   a second frequency divider configured to divide the second clock signal by a second integer to produce a second auxiliary signal;
   a phase/period comparator comprising a first time to voltage converter receiving the first auxiliary signal, a second time-to-voltage converter receiving the second auxiliary signal and a voltage comparator connected to the first and a second time to voltage converter, the phase/period comparator being configured to generate an error signal by individually weighting and comparing the cycle durations or phasing of the first and second auxiliary signals; and a voltage-controlled oscillator controlled by the error signal to generate the second clock signal.

2. The time base generator of claim 1, wherein the first and second time-to-voltage converters are dimensioned differently to provide the individually weighted cycle durations or phasing of the first and second auxiliary signals.

3. The time base generator of claim 1, wherein the voltage comparator is configured to differently weight the voltages obtained from the first and second time to voltage converters.

4. The time base generator of claim 1, wherein the time base generator is incorporated into one of a radar, a laser, and a time-domain reflectometer, wherein the first clock signal triggers a transmitter to produce a transmit signal, and wherein the second clock signal gates or is mixed with detected echoes of the transmit signal.

5. A method for providing a first clock signal and a second clock signal, frequencies of the clock signals being different from each other, said method comprising:

providing the first clock signal at a first clock frequency;

dividing the first clock frequency by a first integer to produce a first auxiliary signal;

dividing a second clock signal by a second integer to produce a second auxiliary signal;

generating an error signal by individually weighting and comparing cycle durations or phasing of the first and second auxiliary signals, time-to-voltage converting the first and second auxiliary signals and comparing voltages obtained from the time-to-voltage converted first and second auxiliary signals voltages; and generating, by a voltage-controlled oscillator, the second clock signal, the voltage controlled oscillator being controlled by the error signal.

6. The method of claim 5, wherein the individually weighted cycle durations or phasing of the first and second auxiliary signals is performed during the time-to-voltage conversion of the first and second auxiliary signals or during the comparison of the voltages obtained from the time-to-voltage converted first and second auxiliary signals voltages.

7. The method of claim 5, wherein the method is implemented in one of a radar, a laser, and a time-domain reflectometer, wherein the first clock signal triggers a transmitter to produce a transmit signal, and wherein the second clock signal gates or is mixed with detected echoes of said transmit signal.

8. The method of claim 6, wherein the method is implemented in one of a radar, a laser, and a time-domain reflectometer, wherein the first clock signal triggers a transmitter to produce a transmit signal, and wherein the second clock signal gates or is mixed with detected echoes of said transmit signal.

* * * * *